United States Patent [19]
Milkovic

[11] 3,942,110
[45] Mar. 2, 1976

[54] ANALOG TO PULSE RATE CONVERTER
[75] Inventor: Miran Milkovic, Scotia, N.Y.
[73] Assignee: General Electric Company, Schenectady, N.Y.
[22] Filed: May 8, 1974
[21] Appl. No.: 467,889

[52] U.S. Cl. ................................ 324/142; 307/271
[51] Int. Cl.² ..................... G01R 7/00; G01R 11/32
[58] Field of Search ..................... 324/142; 307/271; 340/310 A

[56] References Cited
UNITED STATES PATENTS

| | | | |
|---|---|---|---|
| 3,500,200 | 3/1970 | Woodhead | 324/142 |
| 3,510,772 | 5/1970 | Luthi | 324/142 |
| 3,525,042 | 8/1970 | Nunlist et al. | 324/142 |
| 3,794,917 | 2/1974 | Martin et al. | 324/142 |
| 3,818,340 | 6/1974 | Yamaguchi | 324/142 |

FOREIGN PATENTS OR APPLICATIONS

| | | | |
|---|---|---|---|
| 472,677 | 6/1969 | Switzerland | 324/142 |
| 801,200 | 12/1968 | Canada | 324/142 |

OTHER PUBLICATIONS
Friedl et al., Portable Electronic Watthourmeter—Standard Published Versions of Lectures Given During the Sept. 1972 IEE Metering Conference in London England, Paper No. 117.

Primary Examiner—Stanley T. Krawczewicz
Attorney, Agent, or Firm—Vale P. Myles

[57] ABSTRACT

A bipolar C-MOS analog to pulse rate converter is disclosed which provides a pulse train at its output having a frequency which is proportional to the magnitude of an analog input signal over a wide dynamic range. An analog input signal is integrated until the output of the integrator reaches a threshold level. A threshold detector generates a signal when the threshold level is reached which signal is coupled to a JK flip-flop. The JK flip-flop changes its state to thereby provide an output pulse and at the same time provide a switching pulse for coupling a DC reference source to the input of the integrator for resetting the integrator to a reference level. The flip-flop is then reset and the integrator again integrates the analog input signal to initiate a second cycle. Since the output frequency of the converter is dependent upon the time required for the output of the integrator to reach the threshold level, the output frequency is directly proportional to the magnitude of the input signal to the converter.

15 Claims, 6 Drawing Figures

ANALOG TO PULSE RATE CONVERTER

BACKGROUND OF THE INVENTION

This invention relates to an analog to pulse rate converter.

In the past, circuits have been provided for converting an analog input signal to an output signal wherein the output signal is a pulse train having a frequency which is related to the amplitude of the input analog signal. These prior art converters have typically been limited to a rather narrow dynamic range. Further, while such converters have been capable of monopolar operation, they have not been easily adapted for converting dual polarity analog input signals to a pulse train having a frequency which is proportional to the magnitude of the input signal.

It therefore is an object of this invention to provide an efficient and accurate analog to pulse rate converter having a wide dynamic range.

It is another object of this invention to provide an efficient, economical and accurate dual polarity analog to pulse rate converter.

Accordingly, this invention relates to an analog to pulse rate converter for converting an input analog signal to an output pulse train having a frequency which is proportional to the magnitude of the input signal. The converter utilizes C-MOS circuitry in order to conserve power and improve the accuracy of the circuit. The circuit includes an integrator for integrating the analog input signal wherein the integrator is operated substantially in its linear region. A threshold detector formed of C-MOS components detects when the output of the integrator reaches a predetermined threshold level. The output of the threshold detector is coupled to a JK flip-flop which provides an output pulse having a predetermined pulse width. The output of the JK flip-flop is coupled back to a reset switch which when closed resets the integrator to a reference level. The JK flip-flop is then reset and the reset switch is opened so that the integrator can then again integrate the analog input signal until the threshold level is again reached.

Other objects, features and advantages of the present invention will become more fully apparent in the following detailed description of the preferred embodiment, appended claims and accompanying drawings in which:

DETAILED DESCRIPTION OF THE PREFERRED EMBODIMENT

Figure 1:
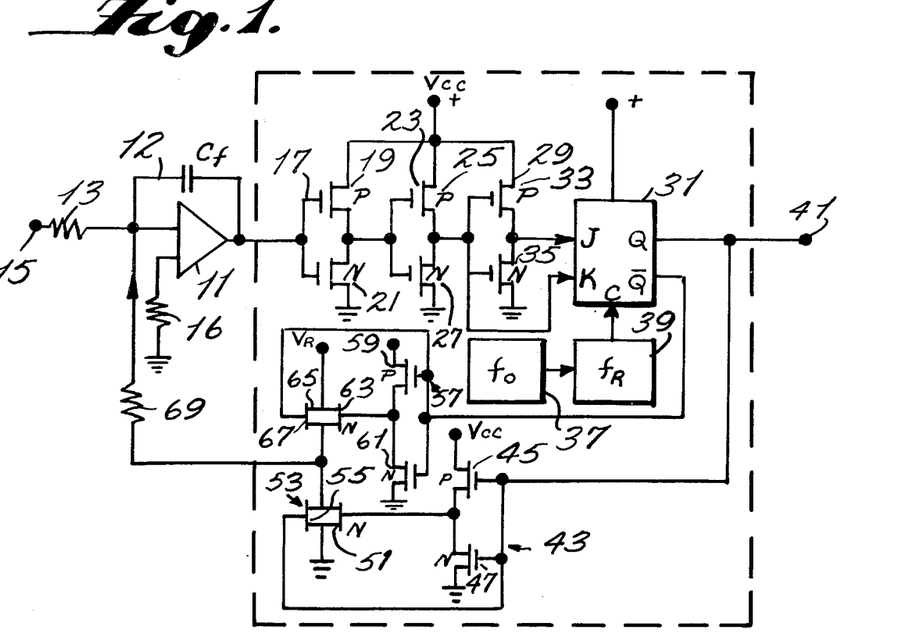
FIG. 1 is a schematic illustration of the analog to digital converter of the present invention.

Refer now to FIG. 1 where there is disclosed a schematic illustration of the analog to pulse rate converter of the present invention. At the input an integrator circuit, generally designated by the numeral 12, is provided which includes an operational amplifier 11 and a feedback capacitor $C_f$. The operational amplifier 11 is illustrated having an input resistor 13 connected to its inverting terminal and a reference resistor 16 connected to its non-inverting terminal. The other end of resistor 13 serves as an input terminal 15 to which an input analog signal is coupled. The operational amplifier 11 may be of any conventional design, such as a conventional bipolar integrated circuit operational amplifier or may preferably be designed with C-MOS circuitry so that it can be combined with the C-MOS circuitry to be described on a monolithic semiconductor chip.

The output of the operational amplifier 11 is connected to a threshold detection circuit generally designated by the numeral 17. The threshold circuit 17 includes a pair of complementary metal oxide semiconductor transistors, hereinafter designated C-MOS transistors. The threshold detector 17 includes transistors 19 and 21 wherein the two transistors are complementary voltage level sensitive types arranged so that the transistors serve as mutual load circuits for each other. Thus, transistor 19 is a P channel MOS transistor having its source terminal connected to a positive DC supply $V_{cc}$ and its drain terminal connected in common with the drain terminal of N channel MOS transistor 21. The source of the N channel transistor 21 is connected to a reference potential, such as ground. The gate terminals of both transistors are connected to the output of the operational amplifier 11.

As will be seen in connection with the description of the operation of the circuit hereinbelow, the threshold detector 17 functions as a comparator since it changes its state whenever the output of the operational amplifier reaches a threshold level. The output of the threshold detector 17 is connected to an inverter circuit 23 which includes a P channel MOS transistor 25 and an N channel MOS transistor 27 wherein the source terminal of the P channel transistor 25 is connected to the DC supply $V_{cc}$ and the drain terminal thereof is connected in common with the drain terminal of N channel transistor 27. The source terminal of the transistor 27 is connected to the reference potential and the gate terminals of both transistors are connected to the output of the threshold detector 17. The output of the inverter 23 is connected to a second inverter 29 and to the K input of JK flip-flop 31. Inverter 29 is identical to inverter 23 and includes a pair of MOS transistors including P channel transistor 33 and N channel transistor 35. P channel transistor 33 and N channel transistor 35 are connected in the same manner as transistors 25 and 27, respectively. The output of the inverter 29 is connected directly to the J input terminal of the JK flip-flop 31.

As is known, MOS transistors are ordinarily provided with substrate terminals. These have been omitted here in the interest of clarity, it being understood that the P channel transistors 19, 25 and 33 have substrate connections which are connected to the positive DC supply $V_{cc}$ while the N channel transistors 21, 27 and 35 have substrate connections which are made to ground.

Figure 5:
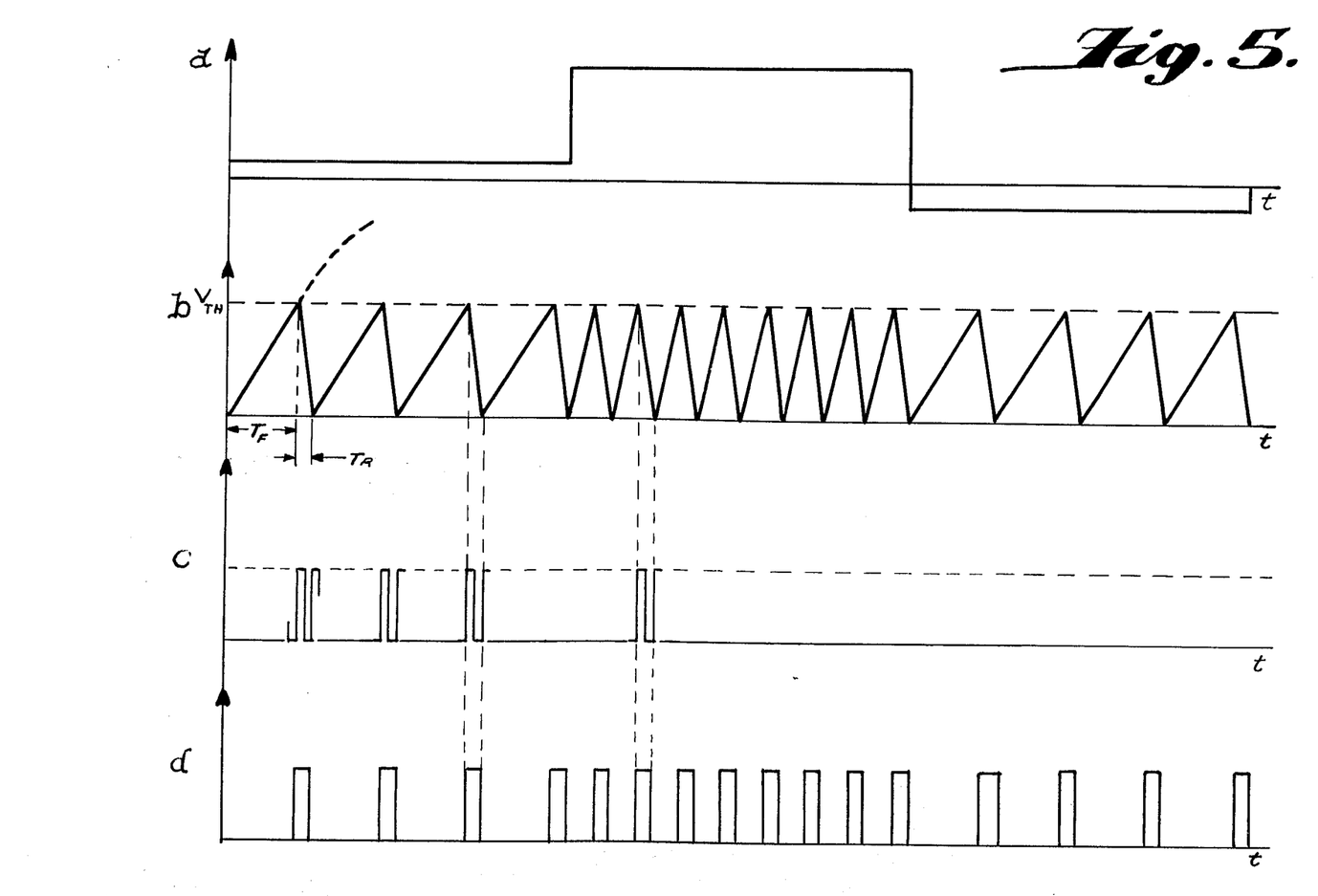
FIG. 5 is a series of graphical displays illustrating the waveforms associated with the analog to pulse rate converter of FIGS. 1 and 2.

In order to provide a clock signal for the JK flip-flop, a 400 kHz quartz crystal oscillator 37 is provided. Quartz crystal oscillators are well known in the art and can be made using C-MOS transistor circuitry or can use other conventional circuit concepts for providing a stable frequency standard. The output of the quartz crystal oscillator 37 is divided down to 6250 Hz by means of a frequency divider 39. Frequency divider 39 may be of conventional design and in the preferred embodiment, utilizes C-MOS divider stages in order to minimize the size of the circuitry and the power utilized therein. The 6250 Hz clocking signal at the output of the divider circuit 39 is in the form of a square wave, as illustrated in FIG. 5c and is utilized to clock the JK flip-flop 31.

The Q output of the flip-flop 31 is connected to an output terminal 41 of the analog to pulse rate converter and in addition is connected to the gate terminals of transistors 45 and 47 which form a level detector circuit 43. The source terminal of the P channel transistor 45 is connected to a positive DC supply $V_{cc}$ and the drain terminal thereof is connected in common with the drain terminal of transistor 47 and to the gate terminal of the N channel transistor 51 of the C-MOS transmission pair 53. The source terminal of transistor 47 is connected to the reference potential. The output of the JK flip-flop 31 is also connected to the gate terminal of the P channel transistor 55 of the transmission pair 53.

The $\overline{Q}$ output of the JK flip-flop 31 is connected to a second level detector 57 which includes a P channel MOS transistor 59 and a N channel MOS transistor 61. The P channel transistor 59 and the N channel transistor 61 are connected in the same manner as the transistors of the level detector 43. The output of the detector 57 is connected to the gate terminal of an N channel transistor 63 which forms a part of a second C-MOS transmission pair 65. The $\overline{Q}$ output of the JK flip-flop 31 is also connected to the gate terminal of the P channel transistor 67 of the transmission pair 65. Transmission pairs such as 53 and 65 are known in the art and act as a gating means when appropriate input signals are coupled to the respective transistors which form the transmission pair. The drain output of each of the transistors which form the transmission pairs is coupled to the inverting input of the operational amplifier 11 via a discharge resistor 69.

The operation of the circuit will now be described. At the outset in order to understand the operation of the circuit, it should be recalled that P channel enhancement mode MOS transistors are turned on when a low gate voltage appears at the gate terminal thereof. By increasing the gate voltage, the conductivity of the transistor is reduced until ultimately the transistor is turned off when a high enough gate voltage is applied thereto. Conversely, for N channel enhancement mode MOS transistors, the transistor is turned on for high gate voltages and is turned off for low gate voltages.

Assume that the input signal at terminal 15 is a negative voltage. This voltage is integrated by the integrating circuit 12 until the voltage across the capacitor $C_f$ reaches a predetermined threshold level. When the threshold level is reached, transistor 19 is turned off and transistor 21 is turned on, thereby driving the voltage at the gate terminals of transistors 25 and 27 to a low voltage. Thus, P channel transistor 25 is turned on and N channel transistor 27 is turned off. Accordingly, the input to the K terminal of the JK flip-flop and to the gate terminals of transistors 33 and 35 approaches the positive source voltage $V_{cc}$. Thus, transistor 33 is turned off and transistor 35 is turned on, therefore driving the voltage at the J input of the flip-flop 31 to a low voltage.

With the input at the J terminal of the flip-flop low and input at the K terminal high, when the clock pulse input to the flip-flop goes high, the output at the Q terminal of the flip-flop goes high and the $\overline{Q}$ output thereof goes low. Thus, transistor 47 is turned on and transistor 45 is turned off, thereby driving the output terminal of the level detector 43 to a low potential. Hence, MOS transistor 51, since it is of the N channel type, is turned off. At the same time, since the Q output of the JK flip-flop 31 is high, the other transistor 55 of the transmission pair 53 is turned off. Hence, the conductive paths through the transmission pair 53 are opened.

The $\overline{Q}$ output of the JK flip-flop which is low is coupled to the gate terminals of the transistors 59 and 61, thereby turning on transistor 59 and turning off N channel transistor 61, thereby driving the output of the level detector 57 high. This output is coupled to the gate terminal of N channel transistor 63 to turn this transistor on. At the same time the low output level at the $\overline{Q}$ of the flip-flop 31 is connected to the P channel transistor 67 to thereby turn this transistor on. With both transistors 63 and 67 conducting, the reference voltage $V_R$ is connected to the integrator via discharge resistor 69. Thus, the charge on the capacitor $C_f$ discharges at a predetermined rate which is determined by the value of the capacitor $C_f$, the value of the resistor 69 and the voltage $V_R$. The resistor 69 and voltage $V_R$ are chosen such that the capacitor $C_f$ will discharge to a reference voltage, such as 0 volts, by the time that one clock pulse cycle at the output of divider 39 has been completed.

When capacitor $C_f$ has been discharged to the reference level, the voltage at the input of the threshold detector 17 has again gone to its low state, thereby reversing the conductive state of the transistors 19 and 21. This in turn causes the outputs of inverters 23 and 29 to be inverted, thereby generating a positive input at the J input of the flip-flop 31 and a negative voltage at the K input thereof. Thus, when the clock pulse input to the flip-flop 31 begins a new cycle, the output voltages at the Q and $\overline{Q}$ terminals of the JK flip-flop are reversed so that the Q output is low and the $\overline{Q}$ output is high. Thus, N channel transistor 47 is turned off and P channel transistor 45 is turned on, thereby generating a positive or high output which is coupled to the N channel transistor 51 of the MOS transmission pair 53. At the same time, the low output of the Q terminal of the JK flip-flop is coupled to the P channel transistor 55 to thereby turn on this transistor so that the transmission pair 53 connects the discharge resistor 69 directly to ground. At the same time, the transmission pair 65 is turned off since the input to the P channel transistor is high and the input to the N channel transistor is low because of the inverting action of the threshold detector 57. Thus, a new integration cycle being immediately after the capacitor $C_f$ has been discharged.

It can be seen that the capacitor $C_f$ of the integrator 12 is charged by an input current, hereinafter designated $I_F$, when an analog voltage is coupled to the input terminal 15. The charge on the capacitor $C_f$ with respect to time is given by the following relationship.

$$Q_F(t) = \int_0^{T_F} I_F dt \qquad (1)$$

where $Q_F$ is the charge on the capacitor $C_f$, $T_F$ is the time required for the capacitor to charge to the threshold level as illustrated in FIG. 5b.

Similarly, the discharge of the capacitor $C_f$ is in accordance with the following relationship:

$$Q_R(t) = \int_{T_F}^{T_F + T_R} (I_R - I_F) dt \qquad (2)$$

where $I_R$ is the discharge current through resistor 69 and $T_R$ is the time required for the capacitor to discharge. Since $Q_F(t) = Q_R(t)$ and $$\int_0^{T_F} T_F dt = \int_{T_F}^{T_F + T_R} (I_R - I_F) dt \qquad (3)$$

the pulse rate or frequency $f$ at the output terminal 41 is, $$f = \frac{1}{T_F + T_R} = \frac{I_F}{I_R T_R} \qquad (4)$$

Also, $$T_R = T_o K_o, \; I_R = \frac{V_R}{R_{69}}, \; I_F = \frac{V_{in}}{R_{13}} \qquad (5)$$

where $T_o$ is the clock oscillator period ($1/f_o$), and $K_o$ is the frequency divider factor ($K_o=64$).

The pulse rate from equations 5 can therefore be given as follows:

$$f = \frac{I_F}{I_R T_R} = \frac{V_{in}}{K} \qquad (6)$$

where K is the analog conversion factor in voltage seconds.

It therefore can be seen from equation 6 that the output pulse rate is directly proportional to the input voltage $V_{in}$ or the input current $I_R$ since $I_R$ and $T_R$ as well as resistors 13 and 69 are constant. Accordingly, an accurate analog to digital conversion is achieved. As aforementioned, the time reference $T_R$ is produced by using a crystal oscillator 37 which oscillates at, for example, 400 kHz. A six-bit binary divider 39 converts the 400 kHz oscillator frequency down to 6250 Hz. The time $T_R$ is the time reference and determines the discharge time of the integrator, while the current $I_R$ is determined by a constant reference source $V_R$ and resistor 69. Thus, an analog to pulse rate conversion is provided which is exceedingly linear over a wide dynamic range.

Figure 2:
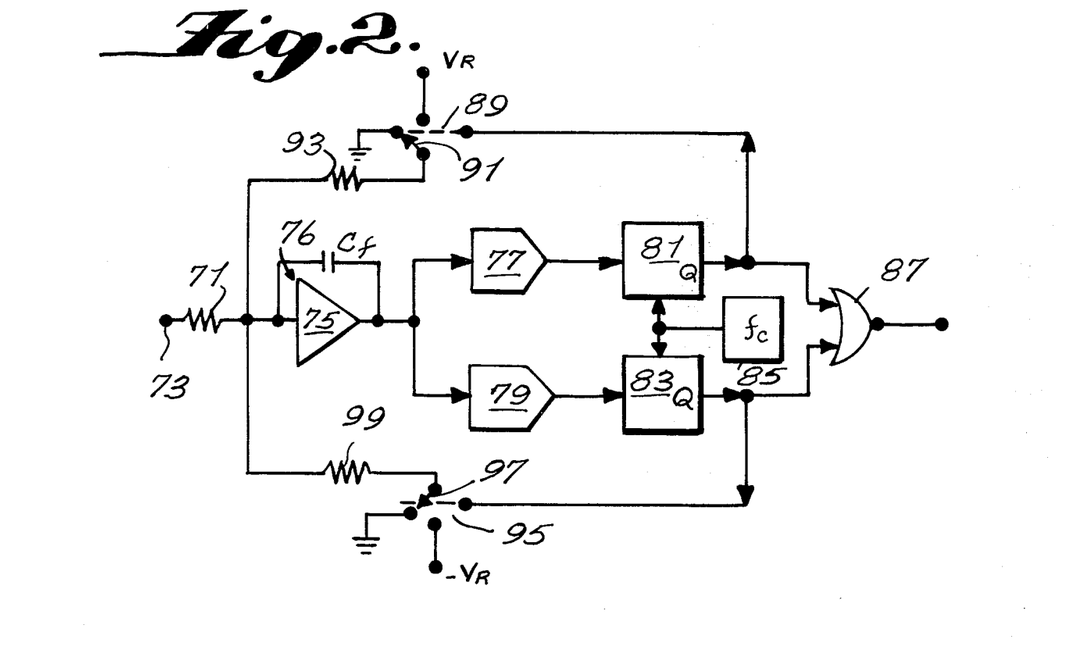
FIG. 2 is a schematic block diagram of an alternate embodiment of the analog to digital converter of the present invention for converting dual polarity analog input signals to an output pulse train.

Refer now to FIG. 2 where there is disclosed a schematic block diagram of a dual polarity analog to pulse rate converter. In this circuit both positive and negative input signals are converted to an output pulse train wherein the frequency of the output pulse train is proportional to the magnitude of the input signal regardless of the polarity of the input signal. A resistor 71 is connected at one end to an input terminal 73 of the converter and at the other end to an operational amplifier 75. The operational amplifier may be of any suitable design known in the art. A feedback capacitor $C_f$ is connected across the input and output terminals of the operational amplifier 75 so that an integrator circuit, generally designated by the numeral 76, is provided. The output of the operational amplifier 75 is connected to a pair of comparators 77 and 79. Comparator 77 provides an output for switching flip-flop 81 when the output of the operational amplifier 75 reaches a positive threshold level and the comparator 79 provides an output for switching flip-flop 83 when the output of the operational amplifier 17 reaches a predetermined negative threshold level. Both flip-flops 81 and 83 are clocked from a suitable frequency source 85 which generates a clock pulse train having a frequency $f_c$. As in the circuit of FIG. 1, the oscillator circuit 85 includes a standard quartz crystal oscillator and an appropriate divider circuit for reducing the clock pulse frequency rate to a desired level.

The Q output of flip-flop 81 is connected to one input of a NOR gate 87 and to a reset switch 89 illustrated schematically in the figure. The reset switch 89 is ordinarily connected to a reference potential such as ground; however, when the Q output of the flip-flop 81 goes high, the switch arm 91 is coupled to a positive reference source $V_R$ to thereby connect the source to the input of the integrator via a discharge resistor 93.

The output of the other flip-flop 83 is connected to the second input of the NOR gate 87 and in addition is connected to a second reset circuit 95 which is schematically illustrated in the figure. The switch arm 97 of the reset circuit 95 is normally connected to a reference potential such as ground but when the Q output of flip-flop 83 goes positive, the switch arm 97 is connected to a negative reference voltage $V_R$. The negative reference voltage $V_R$ is connected to the input of the integrator via a discharge resistor 99.

In operation, when for example, a positive analog signal is coupled to the input terminal 73, the capacitor $C_f$ charges until the output of the operational amplifier 75 reaches a predetermined negative threshold voltage. When this occurs, comparator 79 generates an output pulse which switches flip-flop 83. Thus, the Q output of the flip-flop 83 goes positive or high, thereby driving the output of the NOR gate 87 low. At the same time, the positive or high output of the flip-flop 83 is coupled to reset switch 95 to thereby cause the negative reference voltage $V_R$ to be coupled to the input terminal of the integrator circuit formed by the operational amplifier 75 and the resistor $C_f$. Thus, the capacitor $C_f$ discharges for a period of time which is determined by the value of the voltage $V_R$ and the resistor 99. The voltage $V_R$ and the resistor 99 are selected such that the capacitor $C_f$ discharges to a reference potential during one cycle of the clock pulse output of oscillator 85, as can be seen with reference to FIGS. 5b and 5c. With capacitor $C_f$ discharged to the reference potential, switch 95 is reset and the integrator again integrates the signal input at terminal 73. This cycle repeats itself with the frequency at the output being determined by the amplitude of the input voltage at terminal 73.

If the input at terminal 73 is negative, the capacitor $C_f$ charges until the output of the operational amplifier 75 reaches a predetermined positive threshold level. When this occurs, comparator 77 provides an output pulse for switching flip-flop 81. Flip-flop 81 then provides a high or positive output at its Q terminal, thereby driving the output of NOR gate 87 to a low voltage. At the same time, the high output of flip-flop 81 is coupled to reset switch 89 which connects the reference voltage $V_R$ to the input of the operational amplifier 75 via discharge resistor 93. Capacitor $C_f$ then discharges through resistor 93 until the output of the operational amplifier 75 reaches a predetermined reference level.

Resistor 93 and reference voltage $V_R$ are selected so that the capacitor $C_f$ discharges to the reference level during one clock pulse cycle, as illustrated graphically by FIGS. 5b and 5c. When capacitor $C_f$ has been completely discharged, switch 89 is reset and the capacitor is again charged through input resistor 71 until the output of the integrator again reaches its threshold level.

Figure 3:
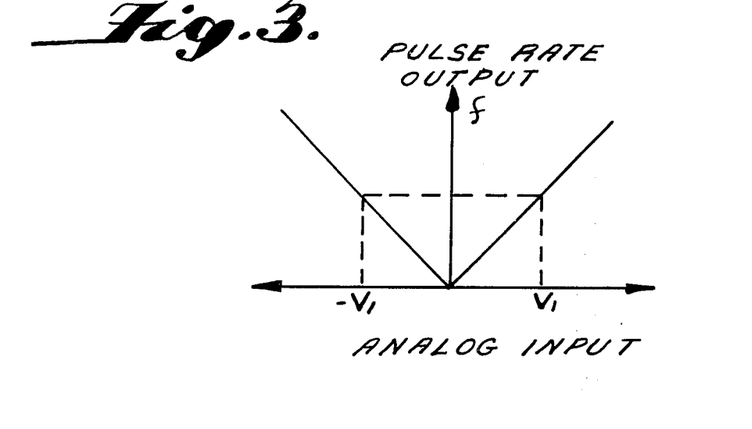
FIG. 3 is a graphical display illustrating the output pulse rate versus input amplitude of the analog to pulse rate converter of FIG. 2.

Referring to FIG. 3, it can be seen that the transfer function of the dual polarity analog to digital converter of FIG. 2 provides a pulse train output having a frequency which is linearly related to the magnitude at the input of the circuit regardless of polarity of the input. Thus, for a positive analog signal having a voltage $V_1$, the converter provides an output pulse train having a frequency $F_1$ and if a negative voltage having the same magnitude $V_1$ as the positive input signal is coupled to the converter, the converter will generate a pulse train at the output thereof having the same frequency $F_1$.

Figure 4:
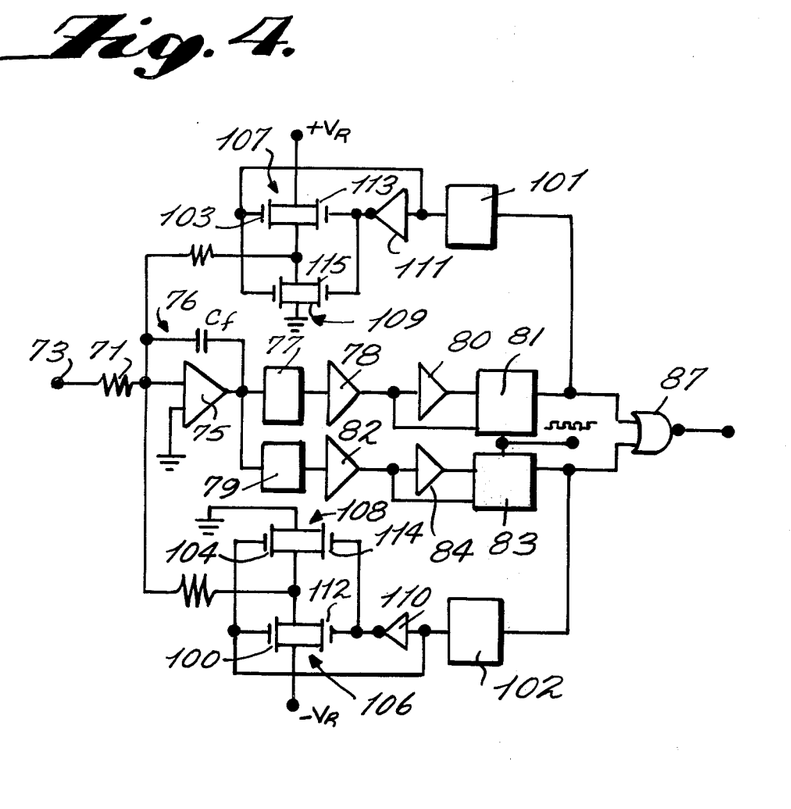
FIG. 4 is a more detailed schematic illustration of the analog to pulse rate converter of FIG. 2.

Refer now to FIG. 4 where there is disclosed a more detailed circuit diagram of the dual polarity analog to digital converter of FIG. 2. An input resistor 71 is connected to the input terminal 73 of the converter and to the inverting input terminal of an operational amplifier 75. The non-inverting input terminal to the operational amplifier 75 is connected to a reference potential such as ground. A feed-back capacitor $C_f$ is connected across the input and output terminals of the operational amplifier 75 to thereby provide an integrating circuit generally designated by the numeral 76. The output of the integrating circuit 76 is connected to a pair of threshold detectors 77 and 79. Threshold detectors 77 and 79 may be of conventional design and if desired, they may be of similar design to the threshold detector 17 illustrated in FIG. 1 which includes a pair C-MOS transistors, one being of the P channel type and the other being of the N channel type. Threshold detector 77 provides an output pulse when the output of the integrator 76 reaches a positive threshold level. The output of threshold detector 77 is connected to a first inverter 78 which may also be of any conventional design known in the art or may include a pair of C-MOS transistors such as the inverter 23 illustrated in FIG. 1. The output of inverter 78 is connected to the K input terminal of the JK flip-flop 81 and in addition is connected to a second inverter circuit 80. The inverter circuit 80 is preferably of the same design as the inverter circuit 78.

The JK flip-flop 81 is clocked by means of a suitable clock pulse train which, as aforementioned, can be generated by a quartz crystal oscillator which has its frequency divided to a desired level by means of a chain of binary divider stages. The output of the JK flip-flop 81 is connected to one input of a NOR gate 87.

The output of the flip-flop 81 is also connected to a level sensor 101 which determines when the Q output of the flip-flop goes positive. The level sensor 101 may be of any suitable circuit design known in the art but in the preferred embodiment is a C-MOS transistor threshold detector similar to the threshold detector 43 illustrated in FIG. 1. If the input to the level sensor 101 is high, the output thereof will be low. This low voltage signal is coupled to the gate terminals of P channel transistor 103 and N channel transistor 105, each of which forms one leg of transmission pairs 107 and 109, respectively. The output of the level sensor 101 is also inverted by C-MOS inverter 111, the output of which is connected to the gate terminals of N channel transistor 113 and P channel transistor 115 which form the other legs of the transmission pairs 107 and 109, respectively. The drain terminals of each of the transistors 103, 105, 113 and 115 are connected in common to a discharge resistor 93 which is connected to the input of the integrator 76. The source terminals of transistors 103 and 113 are connected to a positive reference source V while the source terminals of transistors 105 and 115 are connected in common to a reference potential such as ground.

If the input signal of terminal 73 is positive, the level detector 79 will generate an output signal when the output of the integrator 76 reaches a predetermined negative level. The output of level sensor 79 is inverted by inverter 82, the output of which is coupled to a second inverter 84 and to the K input of JK flip-flop 83. The output of the inverter 84 is connected to the J input terminal of flip-flop 83. Both the inverters 82 and 84 are of similar design to inverters 78 and 80, with the exception that a negative bias supply is utilized and the positions of the N channel and P channel transistors with respect to the reference potential, i.e., ground, are reversed. The flip-flop 83 is clocked by the same clock source as flip-flop 81 and the output of the flip-flop is connected to the second input terminal of NOR gate 87.

The output of flip-flop 83 is also connected to a level sensor 102 which determines when the Q output of flip-flop 83 goes positive. The level sensor 102 inverts the input signal thereto with the inverted signal being coupled to the gate terminals of P channel transistor 100 and N channel transistor 104, each of which forms one leg of transmission pairs 106 and 108, respectively. The inverted output of the level sensor 102 is also connected to an inverter 110, the output of which is connected to the gate terminals of N channel transistor 112 and P channel transistor 114, each of which forms the second leg, respectively, of transmission pairs 106 and 108. The drain terminals of each of the transistors 100, 104, 112 and 114 are connected in common to a discharge resistor 99 which in turn is connected to the input of the integrator 76. The source terminals of transistors 100 and 112 are connected in common to a source of negative reference voltage $V_R$ while the source terminals of transistors 104 and 114 are connected in common to a reference potential such as ground.

With reference to FIG. 5, the operation of the analog to pulse rate converter of FIG. 4 will now be described. As illustrated in FIG. 5a, an analog input signal of variable amplitude is coupled to the input terminal 73 of the analog to pulse rate converter. The input signal is illustrated as having three amplitude levels; however, it should be understood that the input signal could have a continuously varying input level. The input signal is integrated by the integrator circuit 76. As illustrated, when the input signal has a low amplitude, a relatively long time $T_R$ is required before the voltage at the output of the integrator reaches the predetermined threshold level $V_{TH}$. When, however, the input signal has a relatively high amplitude, the integrator integrates to the threshold voltage $V_{TH}$ in a rather short interval of time. It should be pointed out that while the integrated signal waveforms illustrated in FIG. 5b are illustrated as going positive for the sake of clarity and to facilitate the description of the invention, for input signals which are positive, the output of the integrator will go in a negative direction and for input signals which are negative, the output of the integrator 76 will go in the positive direction.

When the output of the integrator 76 reaches a threshold level, level sensor 79 provides an output signal which is inverted by inverter 82. The output of inverter 82 is coupled to the K input of JK flip-flop 83 and to the input of a second inverter 84. The output of inverter 84 is coupled to the J input of the flip-flop 83. Thus, the JK flip-flop 83 generates a high output at the Q terminal thereof to thereby provide an output pulse to the output terminal 116 via the NOR gate 87, as illustrated in FIG. 5b. The output of the flip-flop 83 is also coupled to level sensor 102 which inverts the output. This inverted signal is coupled to the gate terminals of transistors 100 and 104, thereby turning on transistor 100 and turning off transistor 104. At the same time the output of level sensor 102 is inverted and coupled to the gate terminals of transistors 112 and 114, thereby turning on transistor 112 and turning off transistor 114. Hence, the source of negative reference voltage $V_R$ is connected to the input of the integrator 76 via discharge resistor 99. Thus, capacitor $C_f$ discharges through resistor 99 during the time period $T_R$, as illustrated in FIG. 5b, which is the time required to complete one cycle of the clock pulse signal coupled to the flip-flops 81 and 83 as illustrated in FIG. 5c. The voltage V and the resistor 99 are selected so that capacitor $C_f$ discharges to reference potential during the fixed period $T_R$. After capacitor $C_f$ has been completely discharged, JK flip-flop 83 is reset and hence transmission pair 108 is turned on while transmission pair 106 is turned off. Thus capacitor $C_f$ again charges with the current $I_F$ provided by the input voltage at input terminal 73. If the input signal is negative, the level sensor 77 detects the output of the integrator and the flip-flop 83 provides the output pulse to output terminal 116 via NOR gate 87. In addition, transmission pair 107 provides the gating means for discharging the capacitor $C_f$ when the threshold voltage is reached.

Refer now to FIG. 5d which illustrates the output pulses at output terminal 116. The output pulses are of substantially uniform pulse duration. The duration being substantially equal to the time $T_R$. However, the time period between pulses or the frequency thereof changes in accordance with the input amplitude. Thus, when the input signal has a low amplitude, the frequency of the output pulses is low while when the input amplitude is high, the pulse frequency is high. This is in accordance with equation (6).

A C-MOS analog to pulse rate or analog to frequency converter has been disclosed which provides a pulse train at its output wherein the pulse rate of the pulse train is proportional to the analog input signal over a relatively wide dynamic range of more than 200:1. Long term stability and low conversion error are provided since such stability and low error levels are dependent only upon the stability of the reference voltages, the resistors and the stability of the output of the quartz crystal oscillator. Since each of these parameters can be maintained quite constant and accurate, the present invention provides exceedingly high accuracy and low conversion error.

Figure 6:
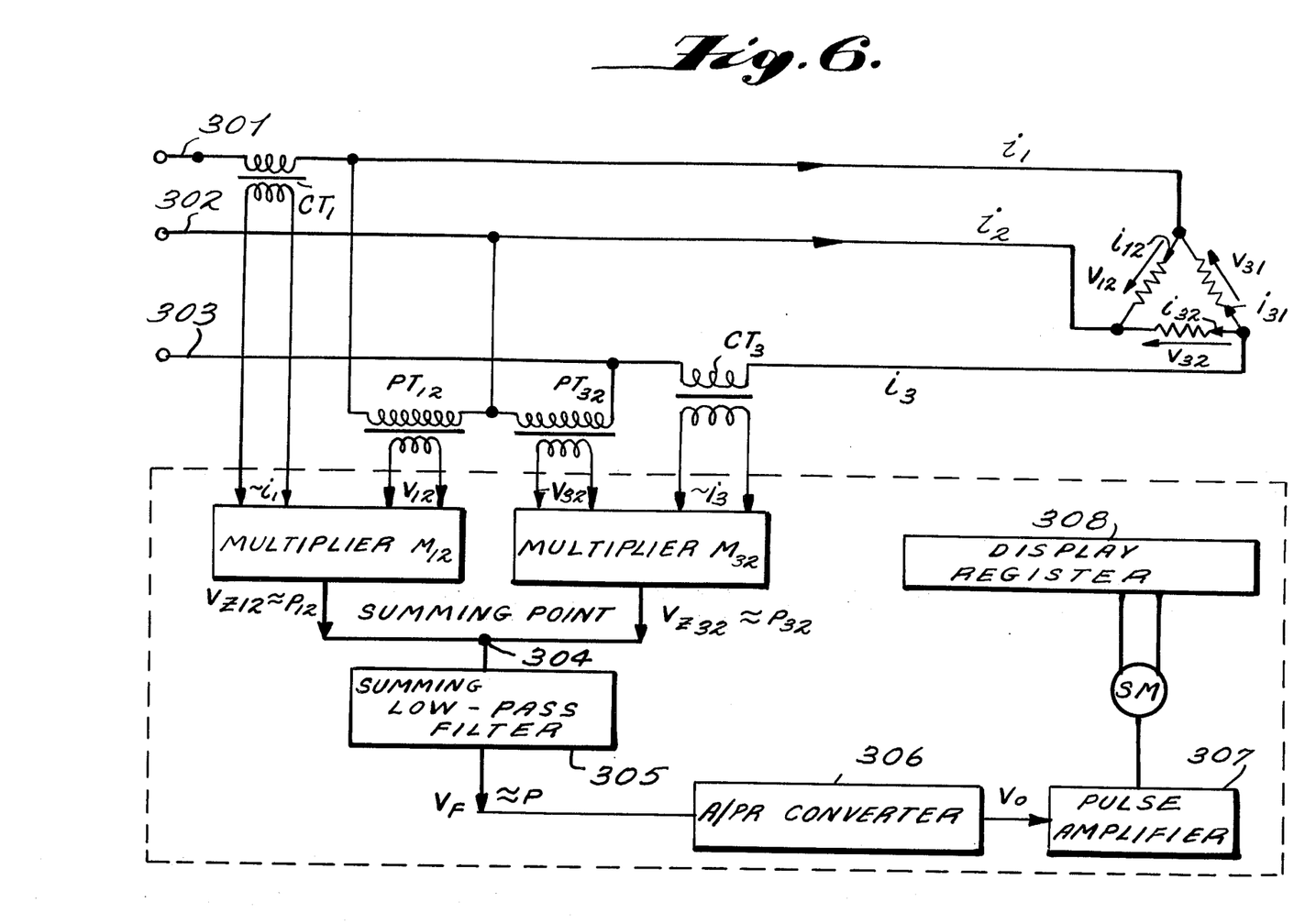

While it should be understood that the present invention can be used in various applications such as in telemetry systems, digital volt meters and analog/digital systems, one preferred application of the invention is in connection with a watt to watt-hour converter such as disclosed and described in U.S. Pat. Application Ser. No. 361,030, filed May 17, 1973, now U.S. Pat. No. 3,875,509, which is hereby incorporated by reference and which is assigned to the common assignee herewith. Such a watt-hour meter is illustrated schematically in FIG. 6. In the simplified diagram of FIG. 6, the three power lines 301, 302 and 303 of a three-phase, 60 Hz electrical system conduct instantaneous line currents $i_1$, $i_2$ and $i_3$ to a deltaconnected polyphase electrical load. Across the three branches of the electrical load three instantaneous line-to-line voltages $v_{12}$, $v_{32}$ and $v_{31}$ are impressed. Two instrument current-transformers $CT_1$ and $CT_3$ as well as two instrument potentialtransformers $PT_{12}$ and $PT_{32}$ are electrically coupled with the transmission lines 301, 302 and 303, as shown in FIG. 6. The aforesaid instrument transformers are coupled with the transmission lines according to the teachings of the wellknown Blondel theorem. Thus, line 302 has been arbitrarily selected as the common point, or line, for carrying out power and energy metering in accordance with the aforesaid theorem. The current transformer $CT_1$ provides an output analog signal representative of the instantaneous line current $i_1$. The current transformer $CT_3$ provides an output analog signal representative of the instantaneous line current $i_3$. The potential transformer $PT_{12}$ provides an output analog signal representative of the instantaneous line voltage $v_{12}$. The potential transformer $PT_{32}$ provides an output analog signal representative of the instantaneous line voltage $v_{32}$. The analog signals representing $i_1$ and $v_{12}$ are delivered to the input of a multiplier $M_{12}$. Similarly, the analog signals representing $i_3$ and $v_{32}$ are delivered to the input of another multiplier $M_{32}$. The multiplier $M_{12}$, in effect, multiplies the signals representing $i_1$ and $v_{12}$ and produces at the output of said multiplier a signal $v_{z12}$ which is proportional to the product $P_{12} = i_1 v_{12}$. The multiplier $M_{32}$, in effect, multiplies the signals representing $i_3$ and $v_{32}$ and produces at the output of said multiplier another signal $v_{z32}$ which is proportional to the product $p_{32} = i_3 v_{32}$. As indicated at FIG. 6, the output signals $v_{z12}$ and $v_{z32}$, which represent instantaneous partial powers $p_{12}$ and $p_{32}$, respectively, are summed at a summing point 304 to provide another signal representing the total instantaneous system power p, where $$p = i_1 v_{12} + i_3 v_{32} \tag{7}$$

The metering principle employed in the illustrative example is based on the use of the Blondel theorem which enables power measurement in, for example, a three-phase electrical system, but uses only two multiplying channels. According to the theorem the power in a system of N lines may be measured by (N-1) wattmeter elements so arranged that each of the (N-1) lines contains one current measuring element with a corresponding potential measuring element being connected between each of the lines and a common point. In the event that the common point happens to be one of the lines (e.g., line 302 in FIG. 6) power can be measured by (N-1) elements. Thus, in the three-wire system of FIG. 6, the total instantaneous power p delivered to the load is:

$$p = i_1 v_{12} + i_3 v_{32} = p_{12} + p_{32} \tag{8}$$

where $v_{12}$ and $v_{32}$ are instantaneous line voltages and $i_1$ and $i_2$ are instantaneous line currents. Also $p_{12}$ and $p_{32}$ are instantaneous partial powers.

In FIG. 6 the signals $v_{z12}$ and $v_{z32}$, representing the aforesaid partial powers $p_{12}$ and $p_{32}$, are combined at the summing point 304 and delivered to an input of a summing low-pass filter 305. The filter 305 sums, or integrates, and averages the aforesaid signals representing the partial powers $p_{12}$ and $p_{32}$ to produce at the output of said filter a signal $V_F$ proportional to the active average total system power P. In effect, the filter 305 performs integrating and averaging operations in accordance with the following relationship:

$$P = \frac{1}{T}\int_o^T i_1 v_{12} dt + \frac{1}{T}\int_o^T i_3 v_{32} dt \qquad (9)$$

or $$P = \frac{1}{T}\int_o^T p_{12} dt + \frac{1}{T}\int_o^T p_{32} dt$$

wherein $$P_{12} = \frac{1}{T}\int_O^T p_{12} dt, \text{ and}$$

$$P_{32} = \frac{1}{T}\int_O^T p_{32} dt$$

Therefore, $$P = P_{12} + P_{32} \qquad (10)$$

where $P_{12}$ and $P_{32}$ are average partial powers and $P$ is average total power.

It can also be shown that the active, average polyphase power P is:

$$P = \sqrt{3} \, V I \cos\theta \qquad (11)$$

where V represents rms line voltage and I represents rms line current; P represents the true active average power in a polyphase load; and $\theta$ is the phase angle.

The output signal $V_F$ at the output of the filter 305 is delivered, as indicated at FIG. 6, to the input of the analog to pulse-rate converter 306 of the present invention which functions to convert the signal $V_F$ (which is proportional to P) to system energy W according to the relationship:

$$W = \int_o^T P \, dt \qquad (12)$$

However, if the time duration $T = T_F$ (i.e., the indicated integration occurring in the A/PR converter 306 for a finite time duration $T_F$) then each time the energy W accumulates to a quantity W in the converter according to the relationship $$W = \int_o^{T_F} P \, dt \qquad (13)$$

an output signal pulse $V_o$, representing a predetermined quantity of electrical energy W, is delivered at the output of the A/PR converter 306. For example, in the specific embodiment illustrated each output signal pulse $V_o$ is representative of the quantized electrical energy W = 1.2 Watt-hours (Wh). Thus, the A/PR converter 306 delivers a series, or train, of pulses $V_o$ at its output; the accumulated number of output pulses $V_o$ representing the total electrical energy W of the system. As aforementioned, the series of pulses $V_o$ has a variable pulse repetition rate f which is proportional to the total average system power P.

As indicated at FIG. 6, the output pulses $V_o$ are delivered to the input of a pulse amplifier 307, the amplified output of which drives a stepping motor SM. The stepping motor SM, in turn, operates an electromechanical kW-hour display register 308 which displays, in decimal digits, the accumulated energy in kilowatt-hours (kW-hours). While a conventional stepping motor SM and electromechanical register 308 are illustrated at FIG. 6, it is to be understood that the stepping motor SM and register 308 are indicated by way of example only. The electrical energy meter according to the present invention may employ, instead of the aforesaid stepping motor and electromechanical register, a liquid crystal or LED display suitably coupled with a nonvolatile electronic memory element and driven by logic circuitry. The Watt-hour meter of FIG. 6 requires an analog to pulse rate converter which has a wide dynamic range and in addition has long term stability and an exceedingly low conversion error. Such an analog to pulse rate converter, as disclosed in the present application, not only provides the aforementioned features but also is compact because of the monolithic circuitry utilized and requires very little power drain because of the utilization of C-MOS circuitry.

While the present invention has been disclosed in connection with a preferred embodiment, it should be understood that there may be other obvious modifications of the invention which fall within the spirit and scope of the invention as defined by the appended claims.

What is claimed is:

1. In an apparatus for metering active electrical energy in a polyphase system including means for generating an analog voltage having a magnitude which is proportional to the average power of said system, the improvement comprising:

an analog to pulse rate converter for converting said average power proportional analog voltage to an output pulse train having a frequency which is proportional to the magnitude of said analog voltage, said converter including means for integrating said analog voltage, means for detecting when the magnitude of said integrated signal reaches a predetermined threshold level, the integrating interval until said threshold level is reached being directly proportional to the magnitude of said input voltage, pulse generating means responsive to said detecting means for generating a pulse each time said integrated signal reaches said threshold level, and means responsive to said pulse generating means for resetting said integrator to a reference level, said integrator being reset within a predetermined time interval wherein the frequency of the pulses generated by said pulse generating means is proportional to the magnitude of said power proportional analog voltage; and means for counting said pulses.

2. The apparatus of claim 1 wherein said pulse generator means includes clock means for defining the pulse width of said generated pulses, said pulses having a pulse width equal to said predetermined integrator reset interval.

3. The apparatus of claim 2 wherein said integrator is a capacitance integrator and wherein said means for resetting said integrator includes a reference voltage source, a first level sensor means for detecting the output of said pulse generator, and gating means responsive to said level sensor means for connecting said reference voltage source to the input of said integrator for discharging said integrator to a reference level.

4. The apparatus of claim 3 wherein said pulse generating means is a flip-flop circuit and wherein said clock means includes a clock pulse generator for generating clock pulses, said clock pulses being coupled to the clock input of said flip-flop.

5. An apparatus for metering active electrical energy in a polyphase N line system comprising means for measuring current in at least ($n$-1) of said lines, means for measuring at least ($n$-1) different line voltages, means coupled with said current measuring means for producing a first plurality of at least ($n$-1) analog signals representing currents measured in the ($n$-1) lines, means coupled with the voltage measuring means for producing a second plurality of at least ($n$-1) analog signals representing the different ($n$-1) line voltages, means for pairing different ones of the current analog signals of the first plurality with different ones of the voltage analog signals of the second plurality such that the different ($n$-1) pairs are representative of the instantaneous power in different parts of said polyphase system, means coupled with said pairing means for converting each of the ($n$-1) pairs of analog signals to a different one of an ($n$-1) series of consecutive signals, each signal in each of the ($n$-1) series representing instantaneous power in a different part of said system, means coupled with said last-mentioned conversion means for converting said signals in said series of consecutive signals to a signal representing average power in the whole system, and an analog to pulse rate converter for converting said average power signal to an output pulse train having a frequency which is proportional to the magnitude of said average power signal, said converter including means for integrating said average power signal, means for detecting when the magnitude of said integrated signal reaches a predetermined threshold level, the integrating interval until said threshold level is reached being directly proportional to the magnitude of said average power signal, pulse generating means responsive to said detecting means for generating a pulse when said integrated signal reaches said threshold level, and means response to said pulse generating means for resetting said integrator to a reference level, said integrator being reset within a predetermined time interval wherein the frequency of the pulses generated by said pulse generating means is proportional to the magnitude of said average power signal.

6. The apparatus of claim 5 further comprising means for recording said pulse train.

7. The apparatus of claim 5 further comprising means for counting the pulses of said pulse train.

8. The apparatus of claim 7 wherein said pulse generating means includes clock means for defining the pulse width of said generated pulses, said pulses having a pulse width equal to said predetermined integrator reset interval.

9. The apparatus of claim 8 wherein said integrator is a capacitance integrator and wherein said means for resetting said integrator includes a reference voltage source, a first level sensor means for detecting the output of said pulse generator, gating means responsive to said level sensor means for connecting said reference voltage source to the input of said integrator for discharging said integrator to a reference level.

10. The apparatus of claim 9 wherein said pulse generating means is a flip-flop circuit and wherein said clock means includes a clock pulse generator for generating clock pulses, said clock pulses being coupled to the clock input of said flip-flop.

11. In an apparatus for metering active electrical energy in a polyphase system including means for generating an analog voltage having a magnitude which is proportional to the average power of said system, the improvement comprising an analog to pulse rate converter for converting a bipolar analog input signal to an output pulse train having a frequency which is proportional to the magnitude of the input signal, said converter including means for integrating said analog input signal, means for detecting when said integrated signal reaches a first amplitude in response to a positive input signal, means for detecting when said integrated signal reaches a second amplitude in response to a negative input signal, said first and second amplitudes being of the same magnitude but of opposite polarity, pulse generating means responsive to said detecting means for generating a pulse when said integrated signal reaches either of said first and second amplitudes, and means responsive to said pulse generating means for resetting said integrator to a reference level, said integrator being reset within a predetermined time interval wherein the frequency of the pulses generated by said pulse generating means is proportional to the magnitude of said analog input signal.

12. The apparatus of claim 11 wherein said pulse generator means includes clock means for defining the pulse width of said generated pulses, said pulses having a pulse width equal to said predetermined integrator reset interval.

13. The apparatus of claim 12 wherein said means for resetting said integrator includes first and second reference voltage sources, a first gating means for connecting said first reference voltage source to the input of said integrator for resetting said integrator to a reference level, second gating means for connecting said second reference voltage source to the input of said integrator for resetting said integrator to a reference level, and means responsive to the output of said pulse generator for selectively closing said first or second gating means in response to the output of said integrator reaching said first or said second amplitude, respectively.

14. The apparatus of claim 12 wherein said detecting means includes first and second threshold detectors, said first threshold detector detecting when said integrated signal reaches said first amplitude and said second threshold detector detecting when said integrated signal reaches said second amplitude and wherein said pulse generating means includes first and second flip-flop circuits, said first flip-flop being responsive to said first threshold detector for generating an output pulse when said first amplitude is reached, said second flip-flop being responsive to said second threshold detector for generating an output pulse when said second amplitude is reached, and means for combining the outputs of said first and second flip-flops into a single pulse train.

15. The apparatus of claim 14 wherein said means for resetting said integrator includes first and second reference voltage sources, a first gating means responsive to the output of said first flip-flop for connecting said first reference voltage source to said integrator for resetting said integrator when said first flip-flop generates a pulse, and second gating means responsive to said second flip-flop for connecting said second voltage source to said integrator for resetting said integrator when said second flip-flop generates a pulse.

* * * * *